Figure 1:
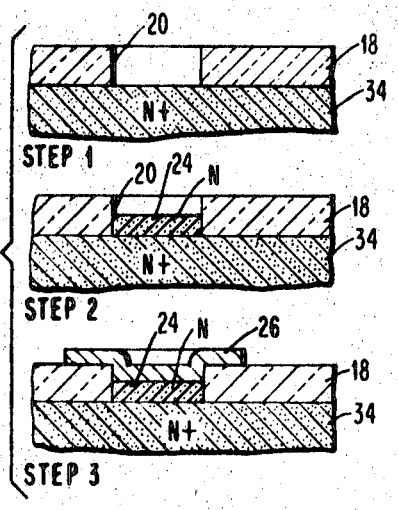
Figure 2:
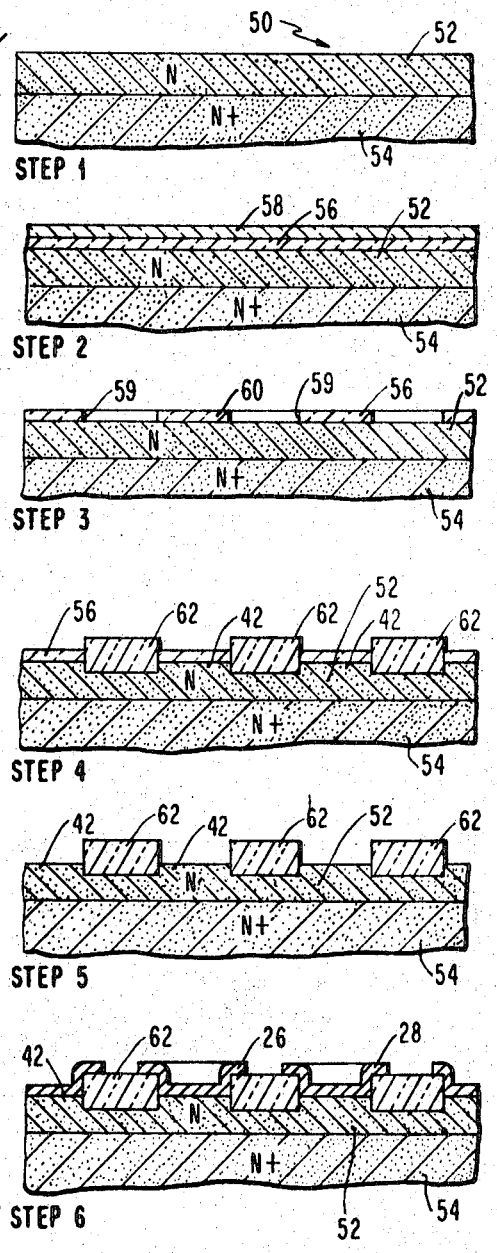
Figure 3:
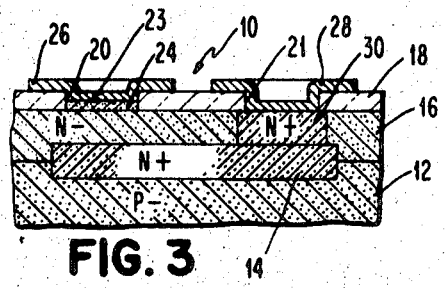
Figure 4:
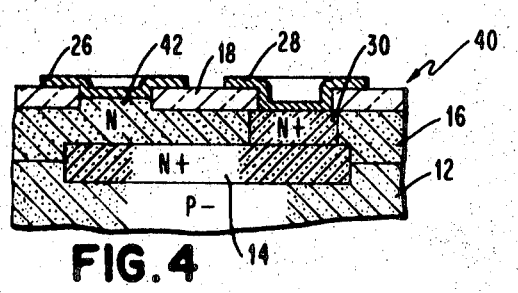
Figure 5:
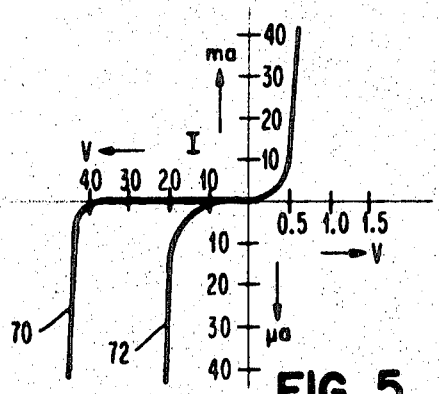

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JUNE 26, 1973

911 O.G. 1138

T911,021

SURFACE BARRIER DIODE AND METHOD OF MAKING

Narasipur G. Anantha and Kanu G. Ashar, Wappingers Falls, N.Y., assignors to International Business Machines Corporation, Armonk, N.Y.

Continuation of application Ser. No. 851,598, Aug. 20, 1969. This application Nov. 10, 1972, Ser. No. 305,636

Int. Cl. H01l *5/02, 19/00*

U.S. Cl. 317—234

1 Sheet Drawing. 16 Pages Specification

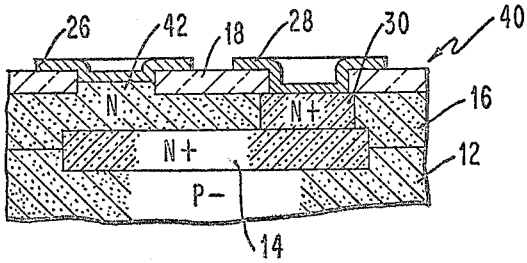

A surface barrier diode, commonly referred to as a Schottky barrier diode, having a semiconductor body, a projecting portion on the body, a low barrier metal on the top surface of the projecting portion, a layer of insulating material over the body, and a terminal means in electrical contact with the layer of low barrier metal, and a second terminal in ohmic contact with the semiconductor body. The method for forming the diode includes the step of forming a projecting portion on a monocrystalline semiconductor body, depositing a low barrier metal on the top surface of the projecting portion, and establishing contact terminals with the low barrier metal and the semiconductor body.

SURFACE BARRIER DIODE AND METHOD OF MAKING

Original Filed Aug. 20, 1969

INVENTORS
NARASIPUR G. ANANTHA
KANU G. ASHAR

BY Wolmar J. Stoffel
ATTORNEY